(12) United States Patent
Chiu (10) Patent No.: US 7,393,774 B2
(45) Date of Patent: Jul. 1, 2008

(54) METHOD OF FABRICATING MICROCONNECTORS

(75) Inventor: Ming-Yen Chiu, Ping-Tung Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 155 days.

(21) Appl. No.: 11/459,645

(22) Filed: Jul. 25, 2006

(65) Prior Publication Data

US 2007/0259508 A1    Nov. 8, 2007

(30) Foreign Application Priority Data

May 3, 2006    (TW)    .............................. 95115714 A (51) Int. Cl.
*H01L 21/4763*    (2006.01)
(52) U.S. Cl. .................. 438/618; 438/455; 438/459
(58) Field of Classification Search .......... 438/455, 438/459, 597, 618, 622, 625
See application file for complete search history.

(56) References Cited

U.S. PATENT DOCUMENTS

| 6,927,471 B2 * | 8/2005 | Salmon ....................... 257/499 |
| 2006/0046350 A1 * | 3/2006 | Jiang et al. ................... 438/114 |
| 2006/0199353 A1 * | 9/2006 | Kub et al. .................... 438/455 |

* cited by examiner

*Primary Examiner*—Tuan H Nguyen
(74) *Attorney, Agent, or Firm*—Winston Hsu (57) ABSTRACT

A method of fabricating microconnectors. A wafer is provided, and a dielectric layer is formed on a first surface of the wafer. The dielectric layer is bonded to a support wafer, and a thinning process is performed. A second surface of the wafer is then bonded to the support wafer, and a conductive wiring pattern is formed on the dielectric layer. An insulating layer is formed on the dielectric layer and the conductive wiring pattern. A portion of the insulating layer is removed to expose the conductive wiring pattern, and a portion of the dielectric layer and the wafer is removed to divide the wafer into a plurality of microconnectors.

11 Claims, 16 Drawing Sheets

METHOD OF FABRICATING MICROCONNECTORS

BACKGROUND OF THE INVENTION

1. Field of the Invention

The present invention relates to a method of fabricating microconnectors, and more particularly, to a method of fabricating a conductive wiring pattern after thinning a wafer to a predetermined thickness so as to efficiently prevent contamination caused by thinning the wafer.

2. Description of the Prior Art

Multi-functional and miniature electronic products have become a trend in electronic product development. In practice, each function generally must be realized in an independent chip. In other words, multi-function applications require multiple-chip solutions. However, if connections between independent chips are formed in a printed circuit board (PCB), a size of an electronic product inevitably grows. Therefore, recent packaging technologies are developed to accommodate a system-in-a-package (SIP). The main idea of the SIP is to set a plurality of chips that form a multi-function application on a connector, such connections between each of the plurality of chips occur across the connector. Furthermore, the aforementioned chips and the connector are packaged together to form a system package structure, and chips are electrically connected to one another through a conductive wiring pattern inside the connector.

Because a size of the connector affects a size of the system package structure, the prior art method of fabricating the connector performs a polishing process on the connector in order to reduce a thickness of the connector after fabricating the conductive wiring pattern inside the connector. In this way, the size of the system package structure is decreased. However, the prior art method as described increases a probability of contaminating the conductive wiring pattern, thereby reducing a process yield.

SUMMARY OF THE INVENTION

One purpose of the present invention is to provide a method of fabricating high-density microconnectors in order to reduce a size of a system package structure.

To achieve the purpose mentioned above, the present invention provides a method of fabricating microconnectors. According to the method of the present invention, a wafer is provided, which wafer comprises a first surface and a second surface. Next, a dielectric layer is formed on the first surface of the wafer, and the dielectric layer is bonded to a support wafer by a first bonding layer. Then, a thinning process is performed to thin the wafer at the second surface of the wafer. Next, the first bonding layer is removed, and then the second surface of the wafer is bonded to the support wafer with a second bonding layer. A conductive wiring pattern is formed on the dielectric layer, and an insulating layer is formed on the dielectric layer and the conductive wiring pattern. Then, a mask pattern is formed on the insulating layer. The mask pattern comprises a plurality of first openings corresponding to the conductive wiring pattern, and a plurality of second openings defining a scribe lines pattern. Next, portions of the insulating layer exposed by the first openings are removed to expose the conductive wiring pattern. Portions of the insulating layer, the dielectric layer, and the wafer exposed by the second openings are removed to divide the wafer into a plurality of microconnectors. Finally, the mask pattern and the second bonding layer are removed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
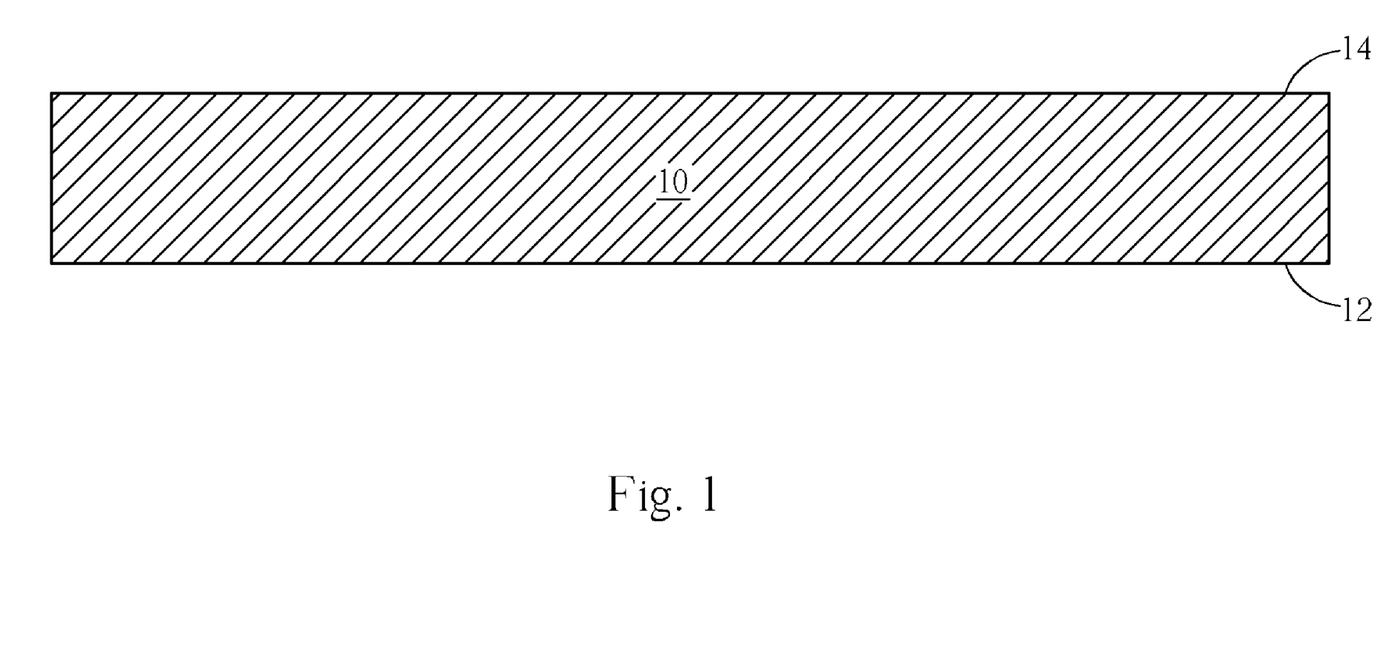
FIGS. 1-16 are schematic diagrams illustrating a method of fabricating a microconnector according to a preferred embodiment of the present invention.
Figure 2:
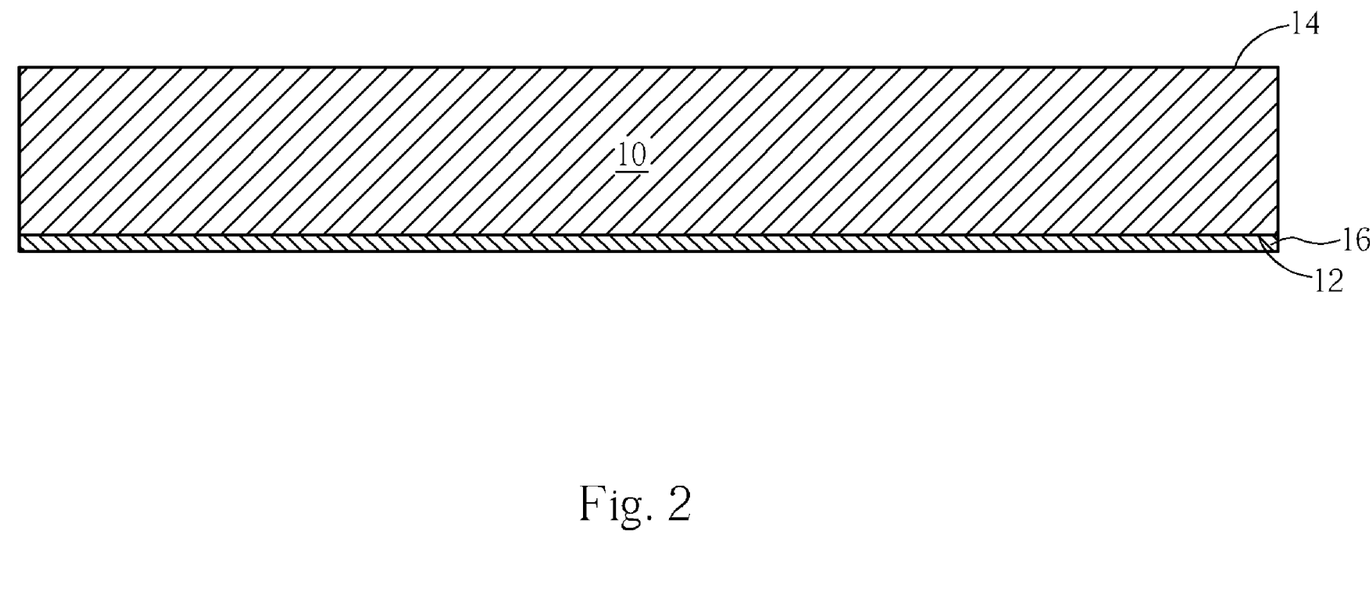

Please refer to FIGS. 1-16. FIGS. 1-16 are schematic diagrams illustrating a method of fabricating a microconnector according to a preferred embodiment of the present invention. As shown in FIG. 1, a wafer 10, such as a silicon wafer, is provided. The wafer 10 comprises a first surface 12 and a second surface 14. As shown in FIG. 2, a dielectric layer 16 is formed on the first surface 12 of the wafer 10. In the preferred embodiment, the dielectric layer 16 is an oxide layer that is formed in a thermal oxidation process. A function of the dielectric layer 16 is to provide an insulating effect that prevents a problem of leakage current. However, a method of forming the dielectric layer 16 and a material of the dielectric layer 16 are not limited. For example, the dielectric layer 16 can be a deposited oxide layer or can be formed of another insulating material.

Figure 3:
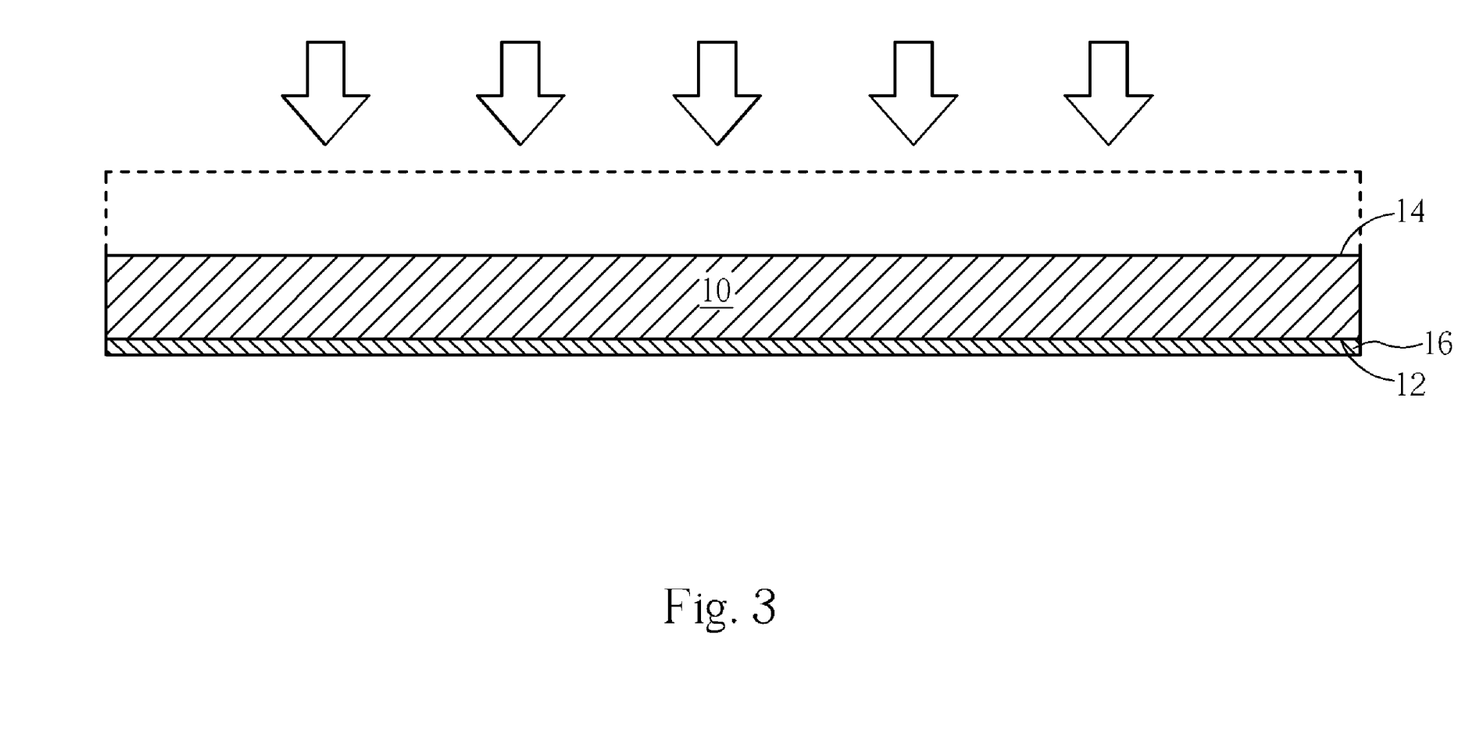
Figure 4:
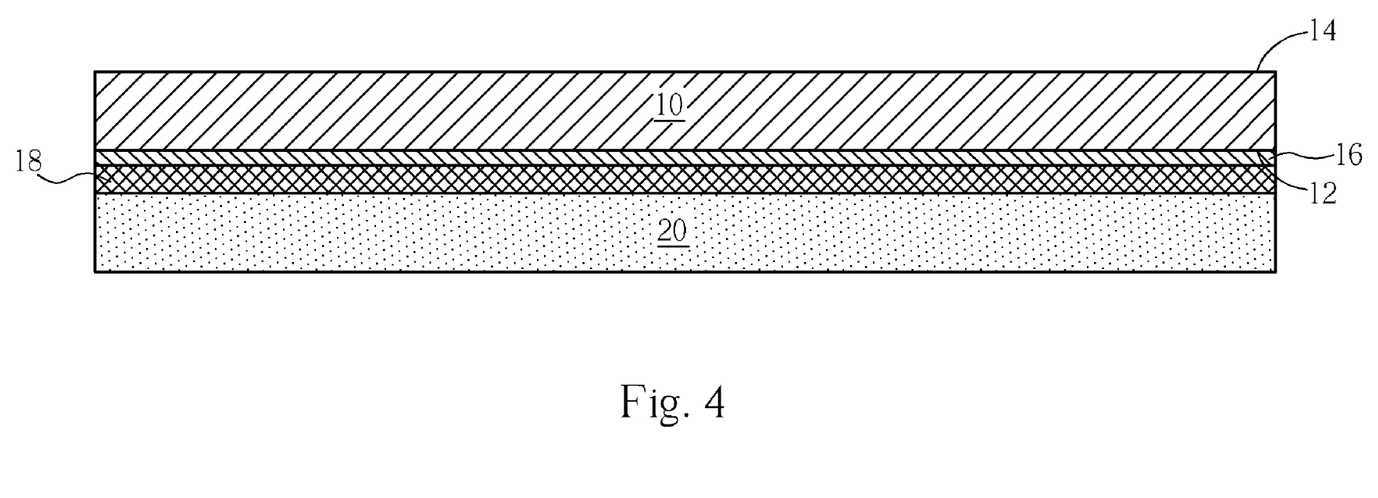

As shown in FIG. 3, a preliminary thinning process is performed on the second surface 14 of the wafer 10. For example, the preliminary thinning process could comprise utilizing a grinding method to rapidly decrease a thickness of the wafer 10 to a suitable thickness, assuming the wafer 10 is not damaged in the preliminary thinning process. As shown in FIG. 4, the dielectric layer 16 is bonded to a support wafer 20 with a first bonding layer 18. The wafer 10 is fixed on the support wafer 20. In the preferred embodiment, the support wafer 20 can be a silicon wafer, a glass wafer, a quartz wafer or a plastic wafer. The first bonding layer 18 is either thermal release tape or ultraviolet (UV) tape. An advantage of using thermal release tape or UV tape for the bonding layer 18 is that the bonding layer 18 can be removed easily by heating or by exposure to ultraviolet light in a later process. However, the first bonding layer 18 is not limited to materials mentioned above, and can be another material such as a photoresist, a wax or polyimide.

Figure 5:
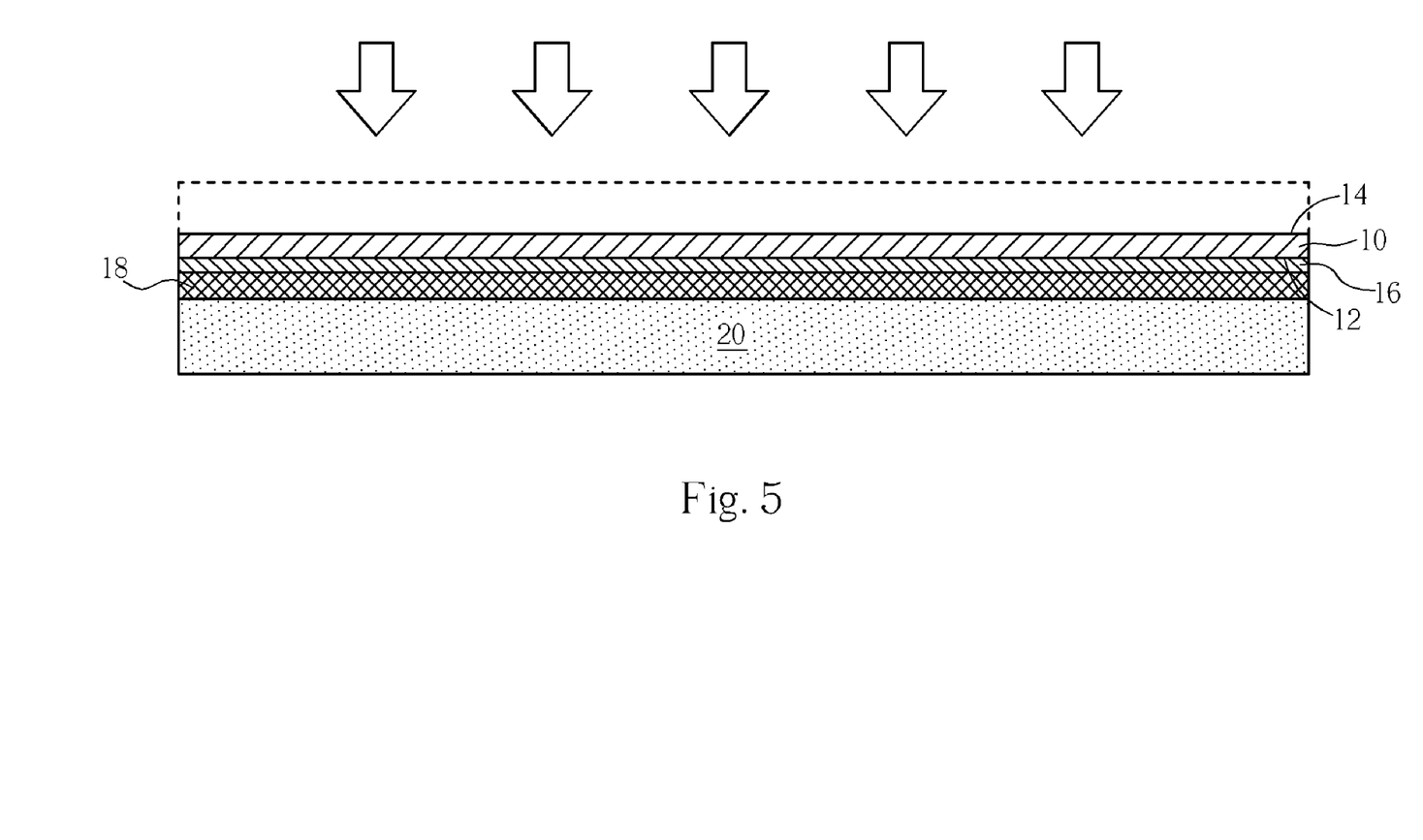

As shown in FIG. 5, a thinning process is performed, and an entire surface of the wafer 10 is thinned at the second surface 14 of the wafer 10. The thinning process can be performed by different methods depending on a final thickness requirement, a surface characteristic requirement and a stress of the wafer 10. For example, the entire surface of the wafer 10 can be thinned by a plasma etching process to reduce a stress produced in the grinding process, the second surface 14 of the wafer 10 can be etched by a chemical etching process to satisfy a requirement for a surface roughness, or the second surface 14 of the wafer 10 can be thinned by a buffing polishing process to meet a surface smoothness requirement. Certainly, the thinning process is not limited to use of the methods mentioned above, but could also be performed through a combination of the processes mentioned above to respond to real conditions, or the thinning process can be accomplished through other thinning techniques, such as a chemical mechanical polishing process.

Figure 6:
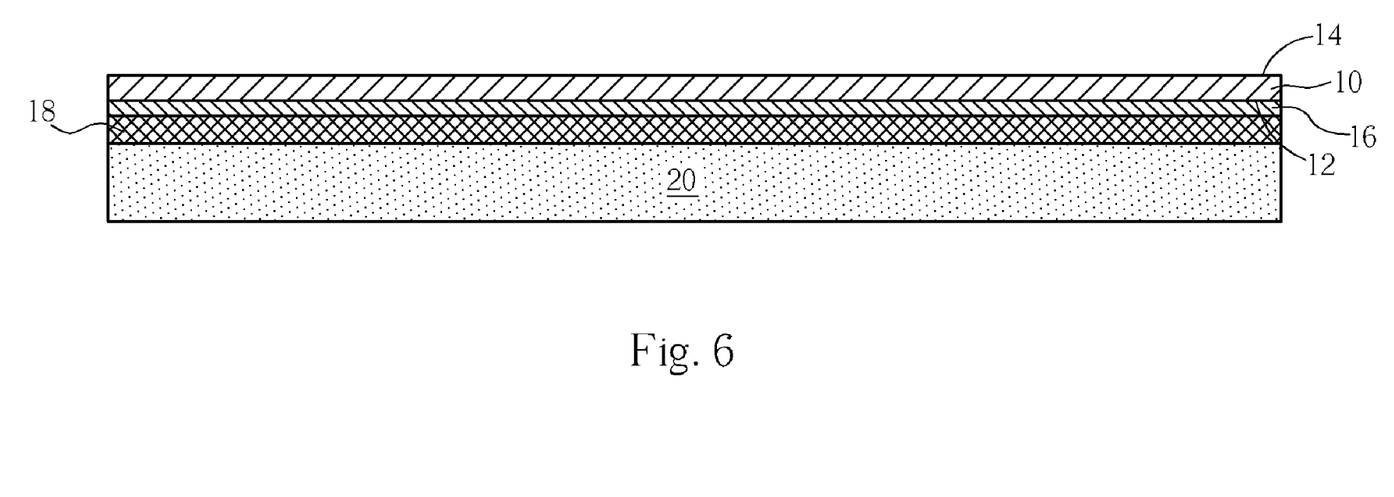
Figure 7:
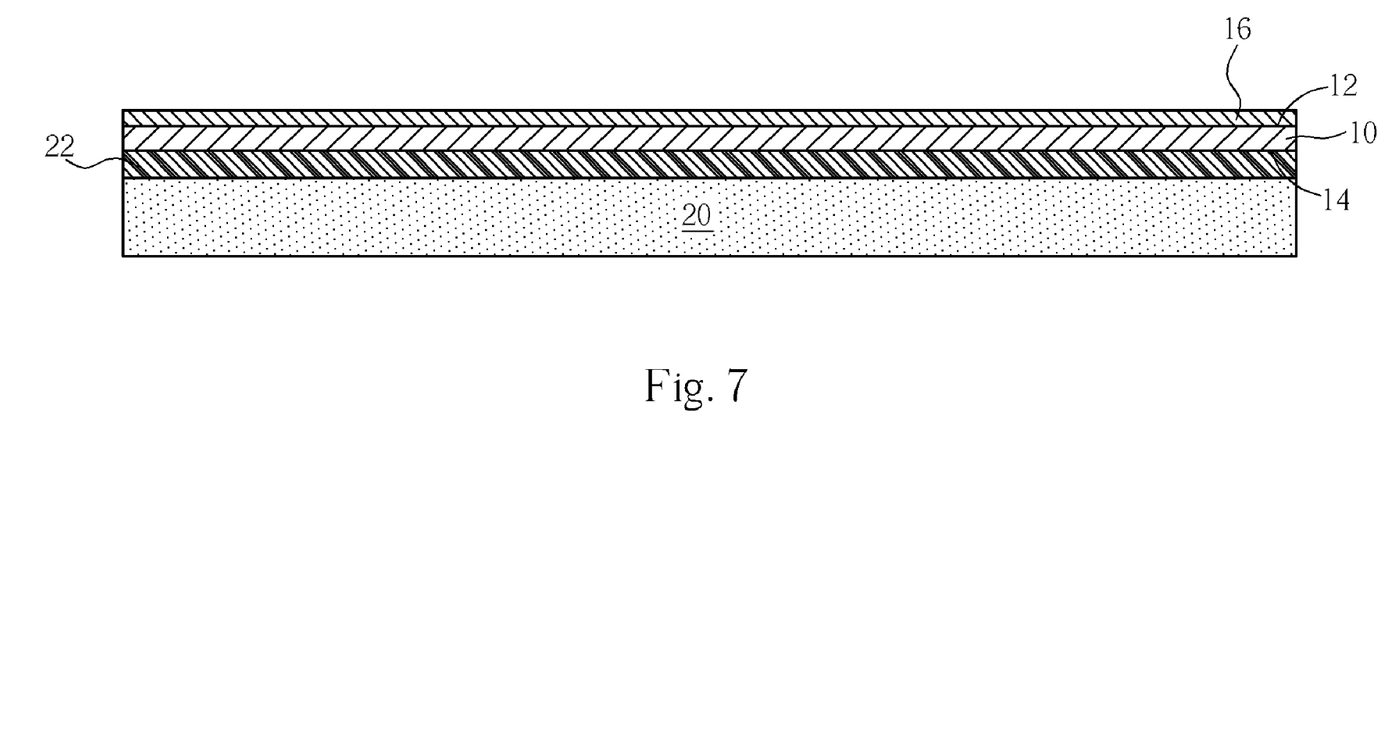
Figure 8:
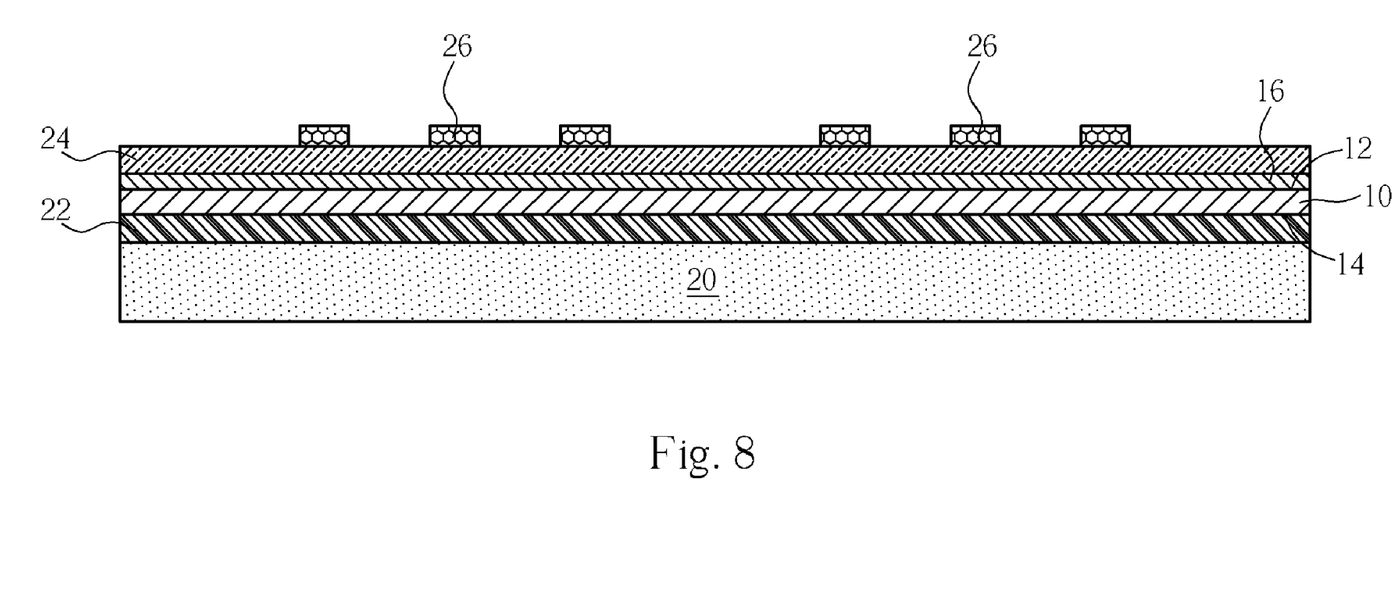

As shown in FIG. 6, after finishing the thinning process, the thickness and the surface characteristic of the wafer 10 conform to requirements of a specification for the microconnectors. Then, as shown in FIG. 7, the first bonding layer 18 is removed, and the second surface 14 of the wafer 10 is bonded to the support wafer 20 with a second bonding layer 22. Similarly, the second bonding layer 22 can be a material such as thermal release tape, UV tape, photoresist, wax or polyimide. Next, as shown in FIG. 8, a conductive layer 24 is formed on the dielectric layer 16, and a mask pattern 26 is formed on the conductive layer 24. The conductive layer 24 can be any material with excellent electrical conductance, such as aluminum, gold, or silver, and can be formed in an electroplating process or a deposition process. In addition, the mask pattern 26 can be a photoresist pattern.

Figure 9:
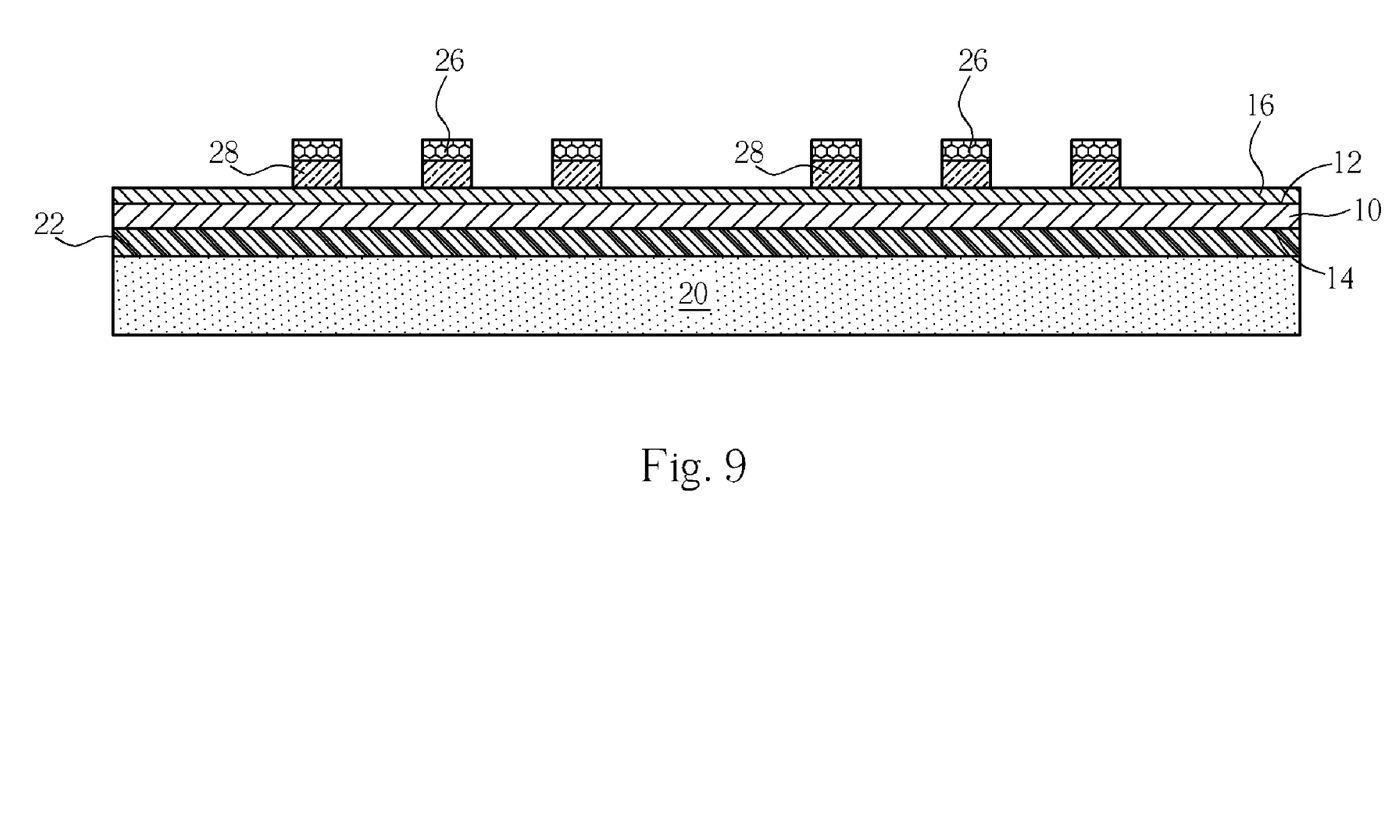
Figure 10:
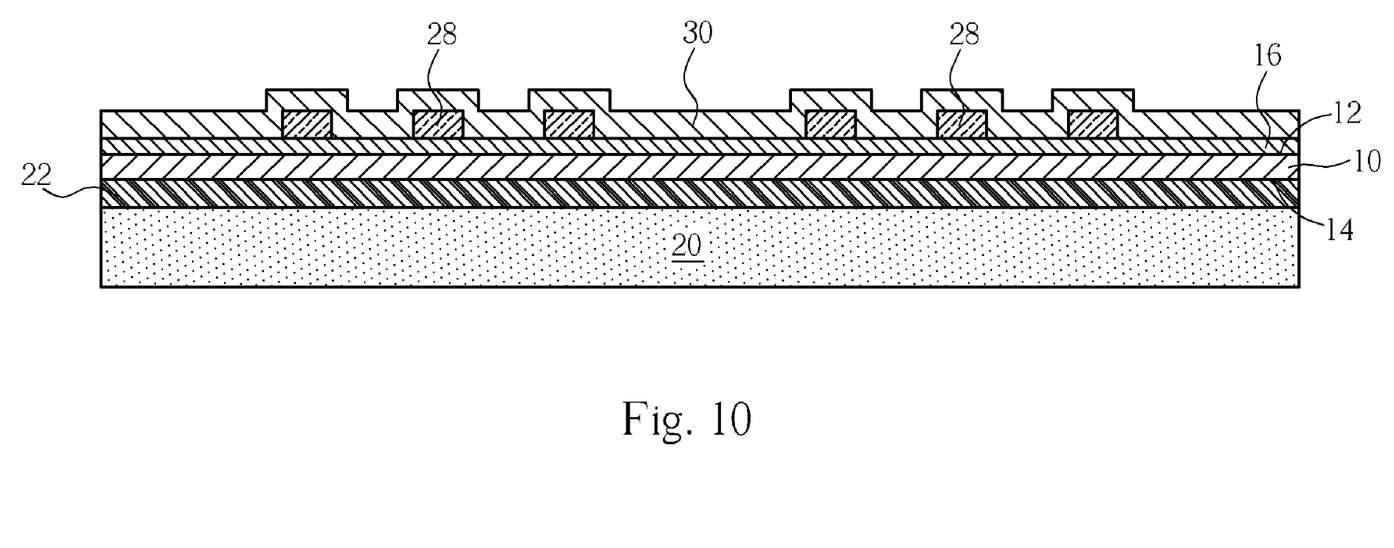

Next, as shown in FIG. 9, by utilizing the mask pattern 26 as an etching mask, the conductive layer 24 can be etched to form a conductive wiring pattern 28 that forms a connecting circuit and bonding pads inside the connector. As shown in FIG. 10, the mask pattern 26 is removed, and an insulating layer 30 is formed over the dielectric layer 16 and the conductive wiring pattern 28. The insulating layer 30 is a material such as silicon oxide, silicon nitride, silicon oxynitride, benzocyclobutene (BCB) or polyimide, and is formed by utilizing deposition or coating, according to a requirement for each material.

Figure 11:
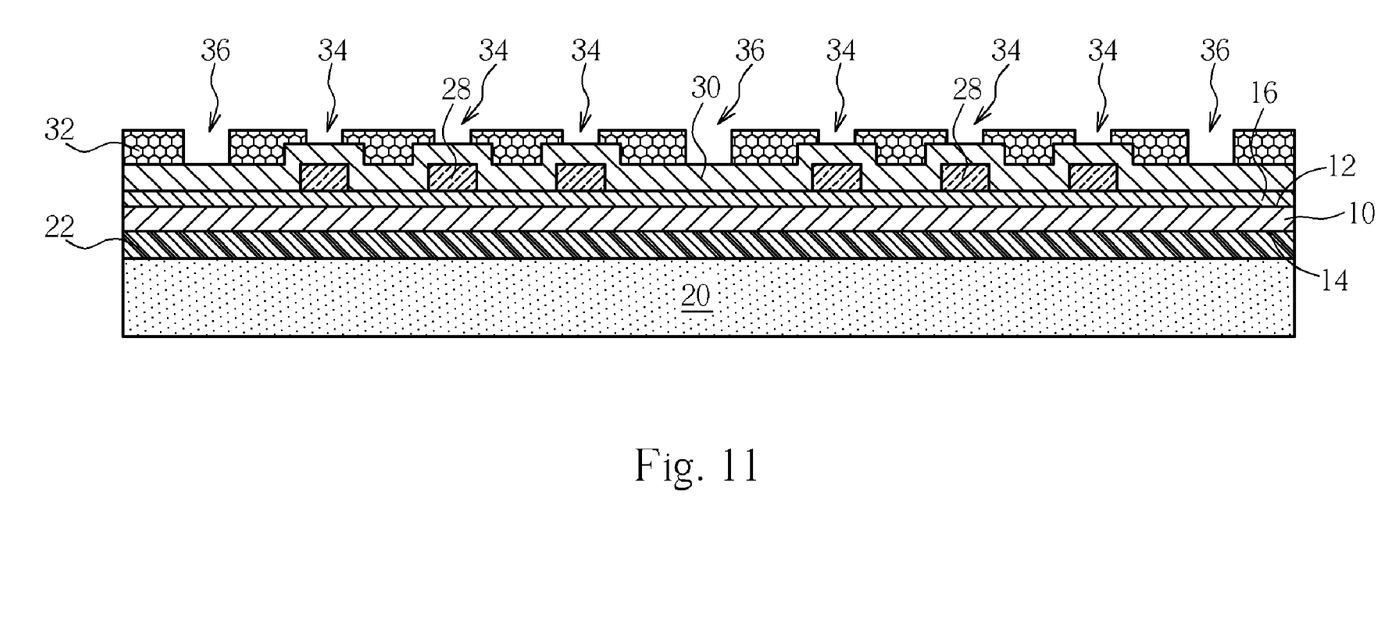
Figure 12:
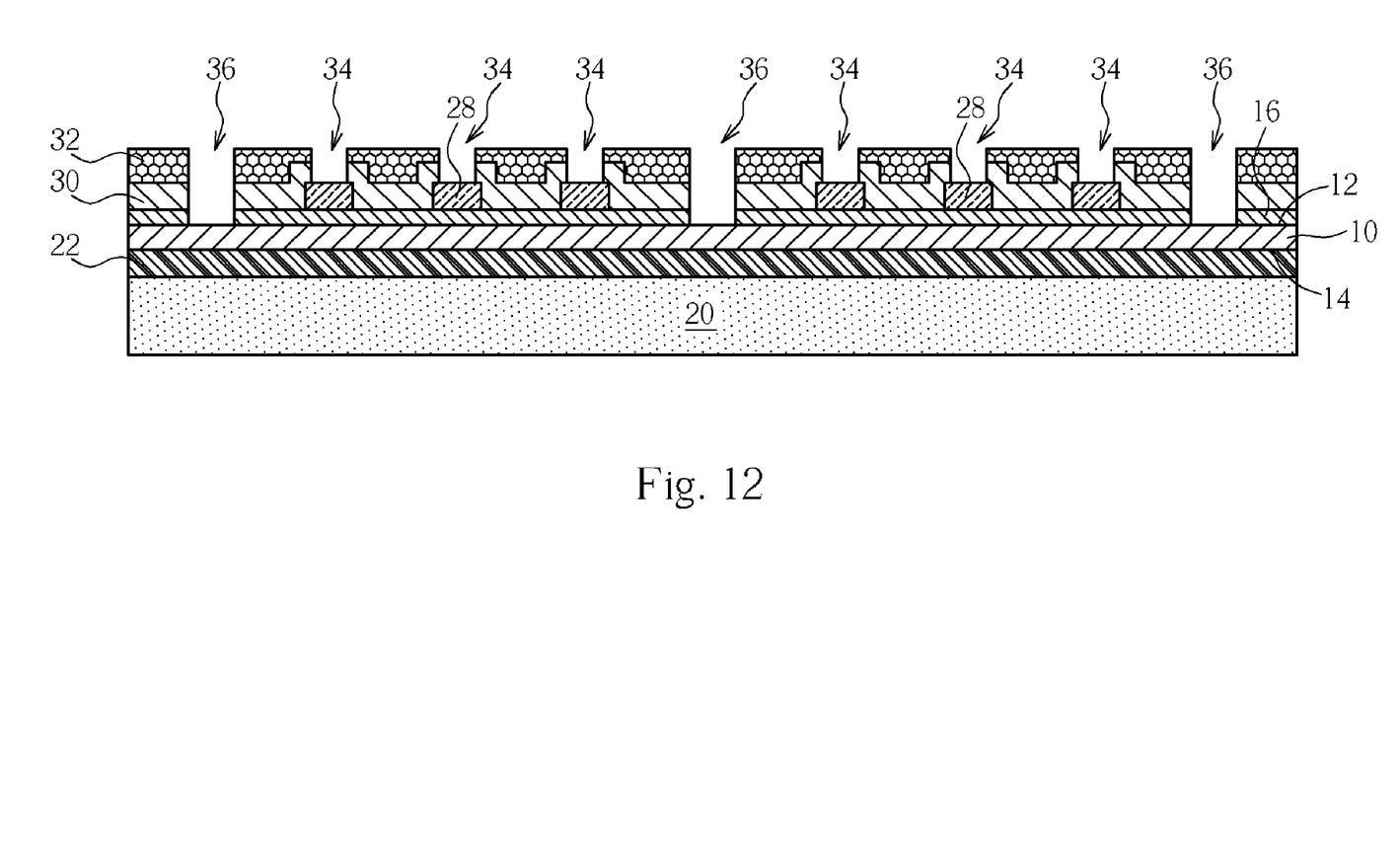
Figure 13:
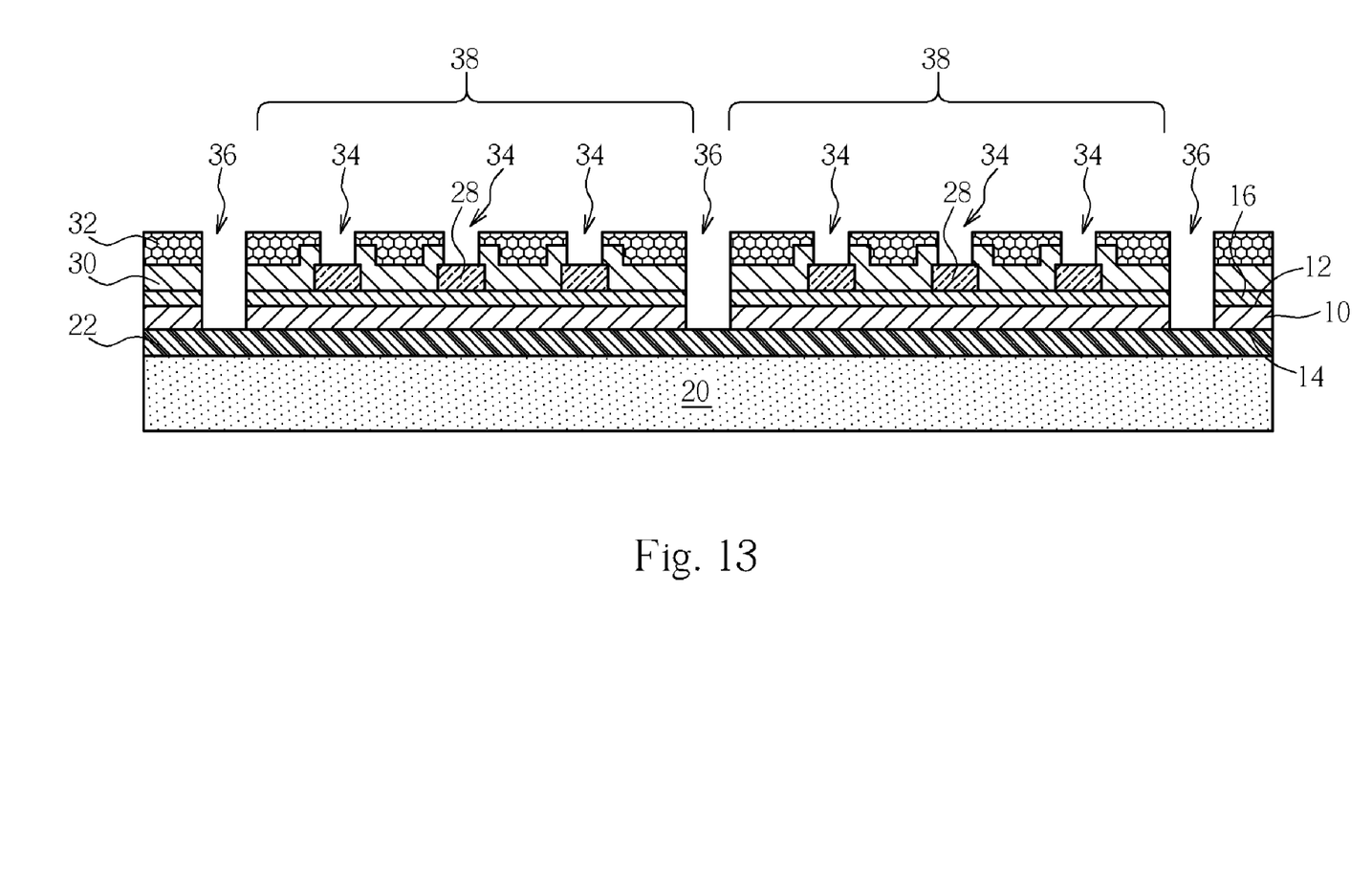

As shown in FIG. 11, a mask pattern 32, such as a photoresist pattern, is formed on the insulating layer 30. In addition, the mask pattern 32 comprises a plurality of first openings 34 corresponding to the conductive wiring pattern 28 and a plurality of second openings 36 defining a scribe lines pattern. As shown in FIG. 12, portions of the insulating layer 30 exposed by the first openings 34 are etched to expose the conductive wiring pattern 28, and portions of the insulating layer 30 exposed by the second openings 36 and portions of the dielectric layer 16 exposed by the second openings 36 are also etched. Next, as shown in FIG. 13, the wafer 10 is directly etched at the second openings 36 with a deep etching technique. At this time, the wafer 10 is divided into a plurality of the microconnectors 38, but the wafer 10 is still fixed to the support wafer 20 by the second bonding layer 22.

Figure 14:
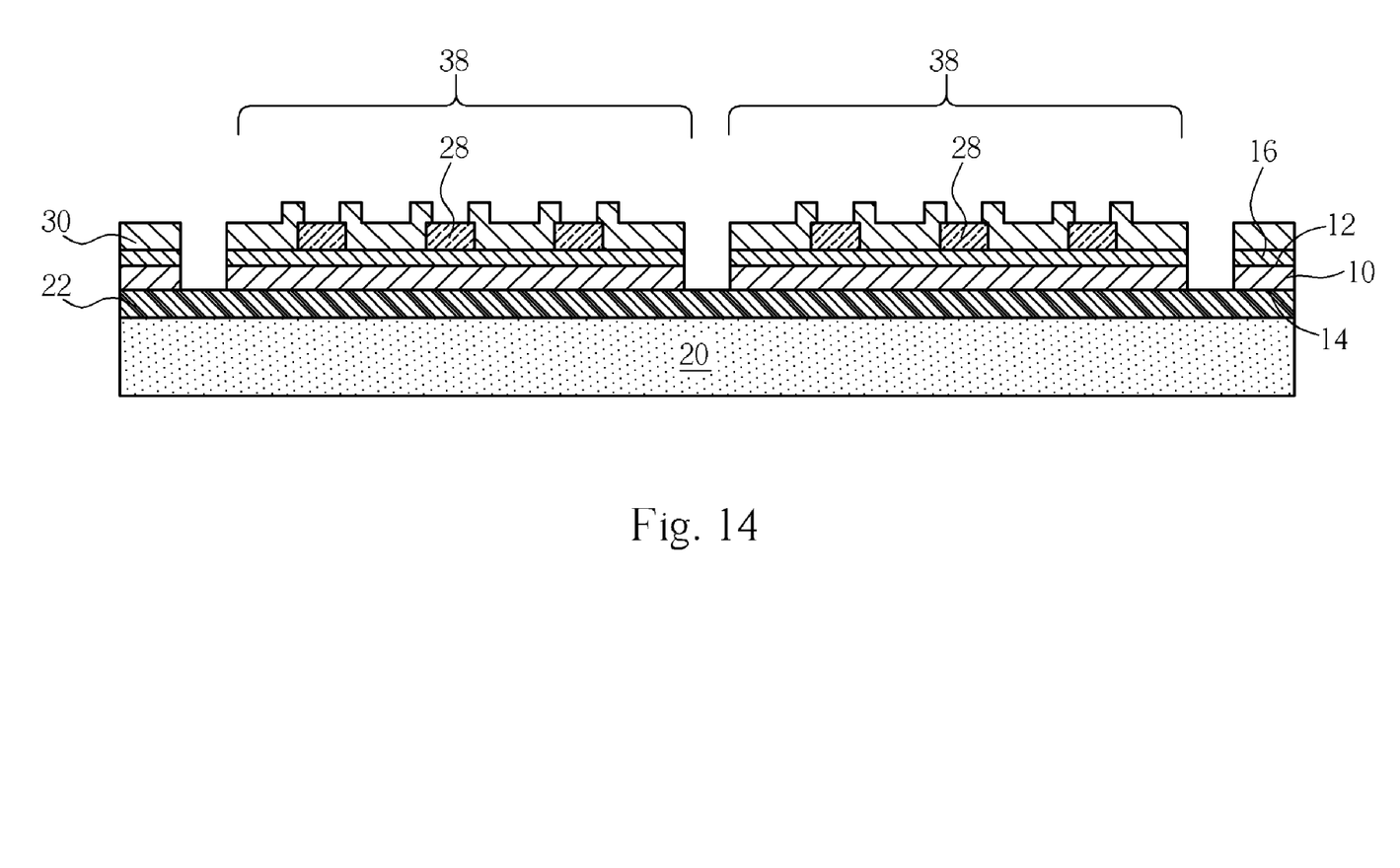
Figure 15:
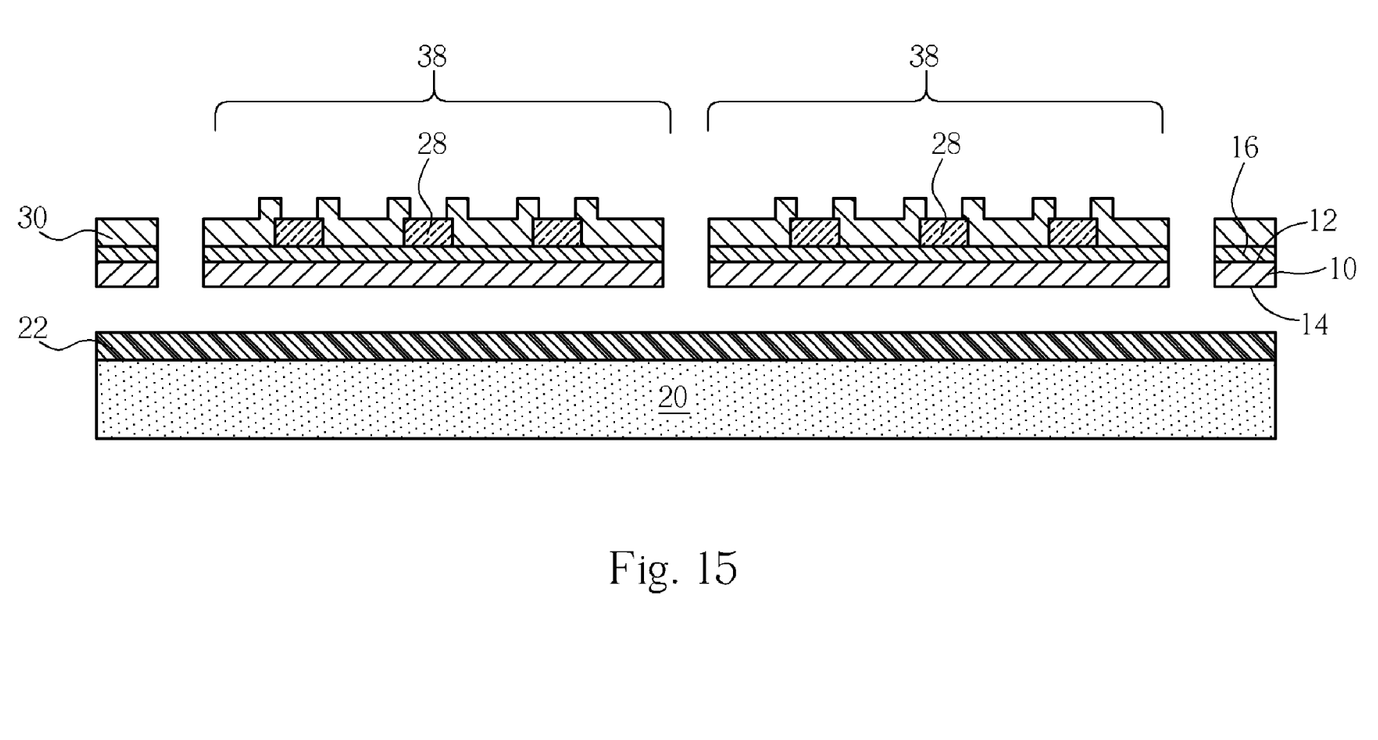
Figure 16:
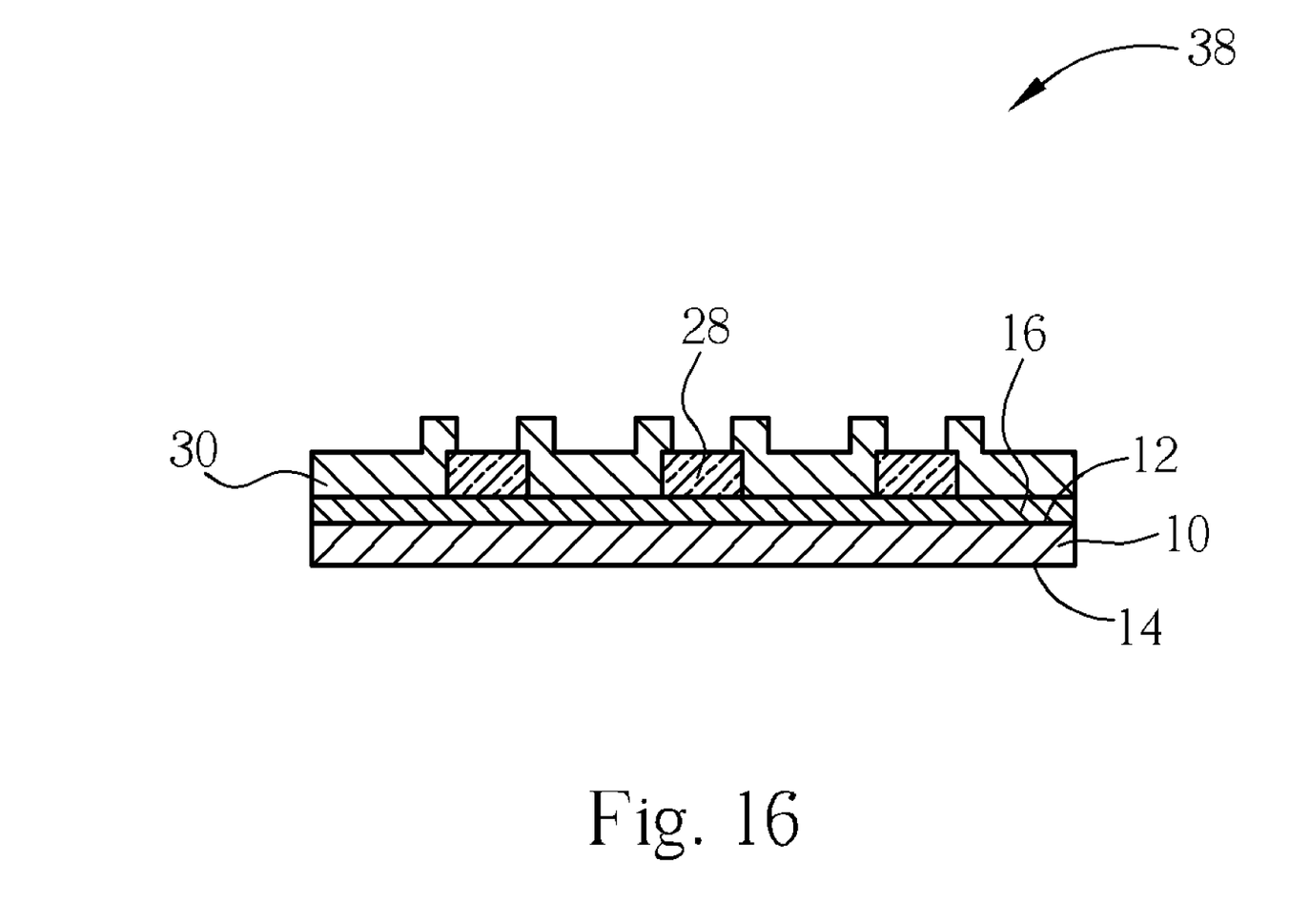

As shown in FIG. 14, the mask pattern 32 is removed from the surface of the insulating layer 30. As shown in FIG. 15, the second bonding layer 22 is removed from the first surface 12 of the wafer 10. As shown in FIG. 16, the microconnector 38 of the present invention is completed.

In summary, the method of fabricating microconnectors of the present invention utilizes the thermal release tape or UV tape as the bonding layer, which efficiently prevents damage to the completed conductive wiring pattern in the later process. In addition, the bonding layer can be removed easily, which can prevent damage occurring after thinning the wafer. Additionally, the present invention utilizes the preliminary thinning process to decrease the wafer thickness rapidly, and the wafer thickness is further decreased to the final thickness by the thinning process, so that the wafer surface has desired surface characteristics. Next, the conductive wiring pattern that enables communication between chips connected through the microconnector is fabricated on the wafer after the thinning process, so contamination is avoided. In addition, the thinning process also lowers stress produced in the preliminary process, thereby preventing the wafer from bending. Finally, the cutting process can be performed during the process of exposing the conductive wiring pattern by utilizing the deep etching technique. Not only does this save time, but an area of the scribe lines can be reduced to increase a density of the chips set on the wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating microconnectors comprising:
   providing a wafer comprising a first surface and a second surface;
   forming a dielectric layer on the first surface of the wafer;
   using a first bonding layer to combine the dielectric layer and a support wafer;
   performing a thinning process to thin the wafer at the second surface of the wafer;
   removing the first bonding layer, and using a second bonding layer to combine the second surface of the wafer and the support wafer;
   forming a conductive wiring pattern on the dielectric layer;
   forming an insulating layer on the dielectric layer and the conductive wiring pattern;
   forming a mask pattern with a plurality of first openings corresponding to the conductive wiring pattern, and a plurality of second openings defining a scribe lines pattern on the insulating layer;
   removing the insulating layer exposed by the first openings in order to expose the conductive wiring pattern, and removing the insulating layer, the dielectric layer and the wafer exposed by the second openings to divide the wafer into a plurality of microconnectors;
   removing the mask pattern; and
   removing the second bonding layer.

2. The method of claim 1, wherein the dielectric layer is an oxide layer.

3. The method of claim 1, wherein the first bonding layer comprises a thermal release tape or an ultraviolet (UV) tape.

4. The method of claim 1, wherein the support wafer comprises a silicon wafer, a glass wafer, a quartz wafer or a plastic wafer.

5. The method of claim 1, further comprising performing a preliminary thinning process to thin the second surface of the wafer before using the first bonding layer to combine the dielectric layer and the support wafer.

6. The method of claim 5, wherein the preliminary thinning process comprises a grinding process.

7. The method of claim 1, wherein the thinning process comprises a plasma etching process.

8. The method of claim 1, wherein the thinning process comprises a chemical etching process.

9. The method of claim 1, wherein the thinning process comprises a buffing polishing process.

10. The method of claim 1, wherein the second bonding layer comprises a thermal release tape or an ultraviolet (UV) tape.

11. The method of claim 1, wherein removing the wafer exposed by the second openings is accomplished by performing deep etching techniques.

* * * * *